US007900183B2

(12) United States Patent
Bhinge

(10) Patent No.: US 7,900,183 B2
(45) Date of Patent: *Mar. 1, 2011

(54) VENDOR INDEPENDENT METHOD TO MERGE COVERAGE RESULTS FOR DIFFERENT DESIGNS

(75) Inventor: Amol V. Bhinge, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 391 days.

This patent is subject to a terminal disclaimer.

(21) Appl. No.: 12/167,958

(22) Filed: Jul. 3, 2008

(65) Prior Publication Data

US 2008/0270865 A1 Oct. 30, 2008

Related U.S. Application Data

(63) Continuation-in-part of application No. 11/252,064, filed on Oct. 17, 2005, now Pat. No. 7,409,654.

(51) Int. Cl.
*G06F 17/50* (2006.01)
(52) U.S. Cl. .................... 716/136; 716/106
(58) Field of Classification Search .............. 716/4, 5, 716/106, 136; 703/14, 16, 17; 714/33, 37
See application file for complete search history.

(56) References Cited

U.S. PATENT DOCUMENTS

| 5,729,554 | A  | * | 3/1998  | Weir et al. ............... 714/739 |
| 5,771,243 | A  | * | 6/1998  | Lee et al. ............... 714/738 |
| 5,844,909 | A  | * | 12/1998 | Wakui .................... 714/704 |
| 6,249,755 | B1 | * | 6/2001  | Yemini et al. ........... 702/183 |
| 6,499,129 | B1 | * | 12/2002 | Srinivasan et al. ......... 716/4 |
| 6,766,473 | B2 | * | 7/2004  | Nozuyama ............... 714/33 |
| 6,859,770 | B2 | * | 2/2005  | Ramsey .................. 703/16 |
| 7,308,658 | B2 | * | 12/2007 | Wood et al. ............... 716/4 |
| 7,409,654 | B2 | * | 8/2008  | Wood et al. ............... 716/4 |

\* cited by examiner

*Primary Examiner* — Sun J Lin
(74) *Attorney, Agent, or Firm* — VanLeeuwen & VanLeeuwen; David Dolezal

(57) ABSTRACT

A method, computer program product, and data processing system for combining results regarding test sequences' coverage of events in testing a plurality of related semiconductor designs are disclosed. Test patterns are randomly generated by one or more "frontend" computers. Results from applying these patterns to the designs under test are transmitted to a "backend" computer in the form of an ordered dictionary of events and bitmap and/or countmap data structures. The backend computer combines results from each test sequence in a cumulative fashion to measure the overall coverage of the set of test sequences over the plurality of designs.

20 Claims, 13 Drawing Sheets

Figure 11

US 7,900,183 B2

VENDOR INDEPENDENT METHOD TO MERGE COVERAGE RESULTS FOR DIFFERENT DESIGNS

CROSS-REFERENCE TO RELATED APPLICATION

The present application is a continuation-in-part of U.S. patent application Ser. No. 11/252,064, entitled "Method and Apparatus for Performing Test Pattern Autograding," filed Oct. 17, 2005, and issued as U.S. Pat. No. 7,409,654 on Aug. 5, 2008, which is incorporated herein by reference in its entirety.

FIELD OF THE INVENTION

The present invention relates generally to the area of automated testing of semiconductor designs. More specifically, the present invention provides a method, computer program product, and apparatus for efficiently ascertaining which testable events a given set of test patterns generates.

RELATED ART

Modern electronics is dominated by the development of "very large-scale integrated circuitry" (VLSI). Advances in solid state technology and sub-micron semiconductor manufacturing processes have allowed smaller and smaller components to be fabricated in integrated circuits. This has allowed designs of unprecedented complexity to be fabricated relatively inexpensively. In the communications field, for example, this evolution has resulted in a gradual shift away from special-purpose analog circuitry to special-purpose digital circuitry to general-purpose stored-program processors executing special-purpose software.

While this trend in favor of general-purpose hardware controlled by software has, in many respects, simplified the design process for many complex systems or allowed the design process to become automated, the general-purpose nature of the underlying hardware makes the process of testing the hardware design more complex. General-purpose hardware, by its very nature, must be capable of handling an enormous number of different kinds of instructions and processing states. Moreover, the complexity of the hardware, in terms of the number of logic gates required, is immense, so that it usually impractical for a test engineer to devise test sequences manually (without computer assistance) to provoke desired behavior from the design under test. For this reason, it is common to employ randomly-generated sequences of inputs to the design (i.e., test patterns), then observe which events (out of a set of events to test the operation of) are triggered by which test pattern(s)—that is, which events are covered by the generated test patterns. Events may be as simple as an occurrence of a particular value on a particular signal line or bus, or they may be complex sequential or time-dependent conditions.

Collecting coverage information for a given set of tests can be very useful, primarily for two reasons. First, it allows a test engineer to know which events are not covered by existing test patterns so that additional test patterns can be generated to cover those events. In U.S. Pat. No. 6,859,770 (RAMSEY) 2005-02-22, for example, coverage information is collected regarding a set of test cases for a VLSI logic circuit, and that coverage information is used by a genetic algorithm to generate new tests to cover events not covered by the current set of test patterns.

Second, coverage data can be used to minimize a given set of test patterns so as to eliminate those test patterns that are redundant. Some of the existing automatic systems/methods for performing this task are described in the following U.S. Patent Documents: U.S. Pat. No. 5,771,243 (LEE et al.) 1998-06-23; U.S. Pat. No. 5,844,909 (WAKUI) 1998-12-01; and U.S. Pat. No. 6,766,473 (NOZUYAMA) 2004-07-20.

Vendors of semiconductor design tools typically provide software means of emulating a given design under test, so that a physical prototype need not actually be constructed initially. These vendor tools generally employ proprietary databases to store the coverage of the tests performed, and it is not uncommon for these databases to contain more information than the testing engineer may actually need. Hence, these databases may become rather large. Integrating test data from a number of such databases can be very difficult and, at best, highly inefficient. Also, because of the way these software tools are installed and licensed, it is often necessary for the emulation software, database, and post-processing software to reside on the same computer. Since a significant amount of post-processing is generally needed to determine the coverage of a given set of test sequences, relying on existing vendor tools can create a tremendous bottleneck in terms of both performance and storage requirements.

The problem of determining test sequence coverage is further complicated by the fact that there may exist multiple versions of a given design or multiple designs sharing common components. Test coverage results generated for one version of a design may be relevant to another version of the design, but manually comparing results generated by different versions of the design (or different designs) so as to be able to leverage previous results can be very difficult and labor intensive. Alternatively, discarding previous results and generating an entirely new set of random test patterns for each design may be overly time-consuming to be practical.

BRIEF DESCRIPTION OF THE DRAWINGS

The present invention may be better understood, and its numerous objects, features, and advantages made apparent to those skilled in the art by referencing the accompanying drawings, wherein:

FIG. 11 is a diagram illustrating data structured generated in a process of combining testcase autograde results across a plurality of designs in accordance with a preferred embodiment of the present invention;

DETAILED DESCRIPTION

The following is intended to provide a detailed description of an example of the invention and should not be taken to be limiting of the invention itself. Rather, any number of variations may fall within the scope of the invention, which is defined in the claims following the description.

Figure 1:
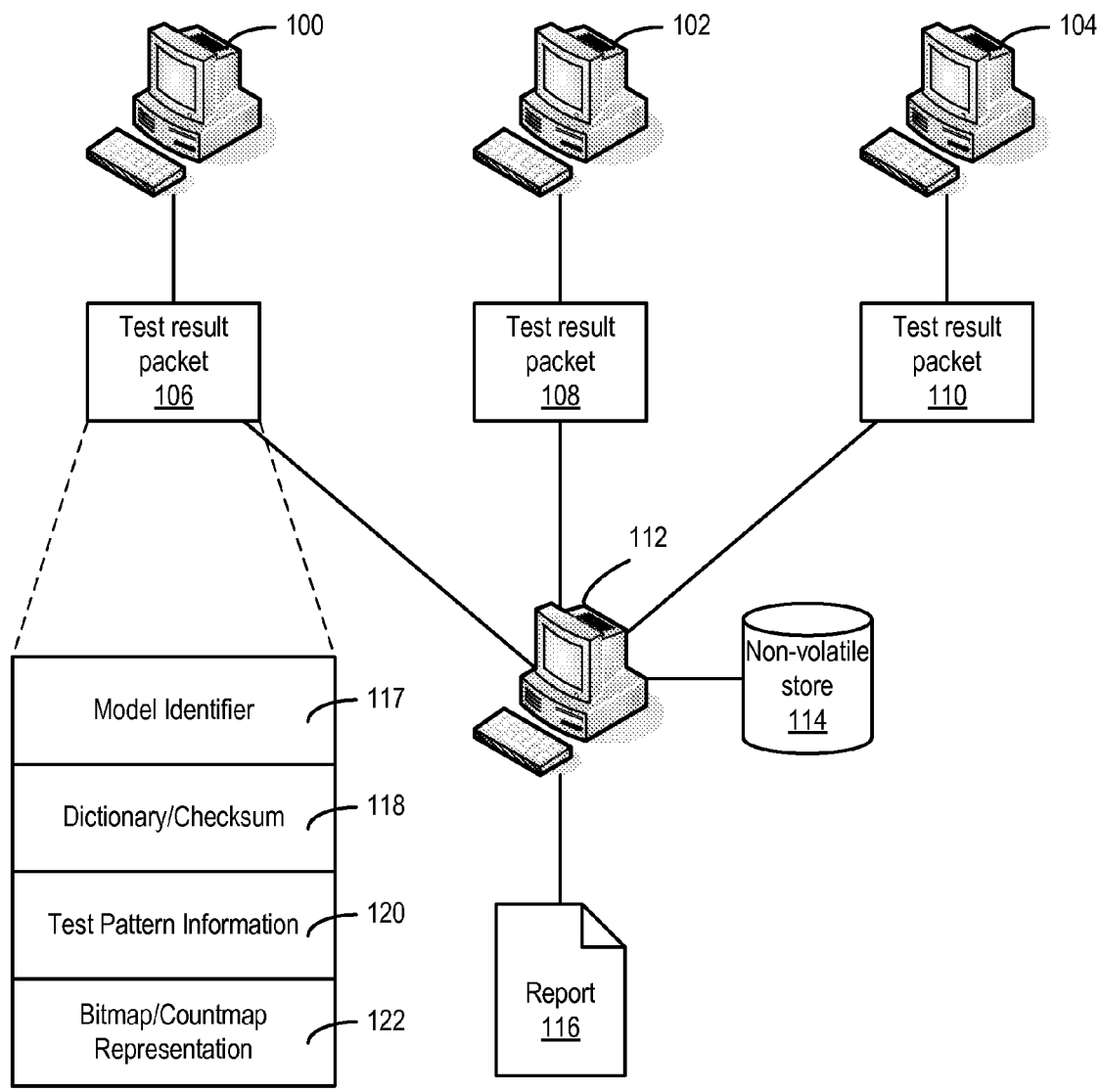
FIG. 1 is a diagram illustrating a distributed computing architecture utilized by a preferred embodiment of the present invention.

FIG. 1 is a diagram illustrating the distributed computing architecture utilized by a preferred embodiment of the present invention for obtaining test coverage information. One or more "frontend" computers (represented here by computers 100, 102, and 104) operate in parallel to generate random test patterns and apply them to the design under test (also referred to as the "model") using appropriate vendor or customer tools created for this purpose. The coverage results of applying each random test pattern are assembled into a packet (packets 106, 108, and 110), which are transmitted to a central "backend" computer 112.

As shown in FIG. 1, each packet includes a number of items of data. A unique model identifier 117 is used to construct a unique location in non-volatile store 114 for the capture of the combined results and report. Dictionary 118, an ordered collection of identifiers corresponding to the different events being monitored for, allows each event to be identified. For a given model, the same events (and hence the same dictionary) will apply to each test pattern. A particular model is uniquely defined by a model name, and another string that is unique by construction. This allows the model to map to a unique location in non-volatile storage. The dictionary can thus be tested for presence using this mapping to determine if a previous test case has been stored against this model. A dictionary is sent if no previous model can be found. More than one test case may be running and simultaneously finding that no test case has been found, and thus multiple dictionaries might be sent. But eventually a test case will be processed and the dictionary of that test case will be saved and the transmission of later test cases will send a checksum instead.

A test case might have a defect in its dictionary due to some miscalculation. If that is the case, the dictionary's checksum will not be correct. If the checksum is not correct, the test case will be rightly rejected for consideration before it is sent.

Another reason a test case might be rejected is that the count for the number of events for a particular test case is negative. If this is the case, then the test case will be rejected and the cumulative results will be reset so that that particular test case will not have changed the cumulative results, nor will the test case be made into a saved test case.

Figure 6:
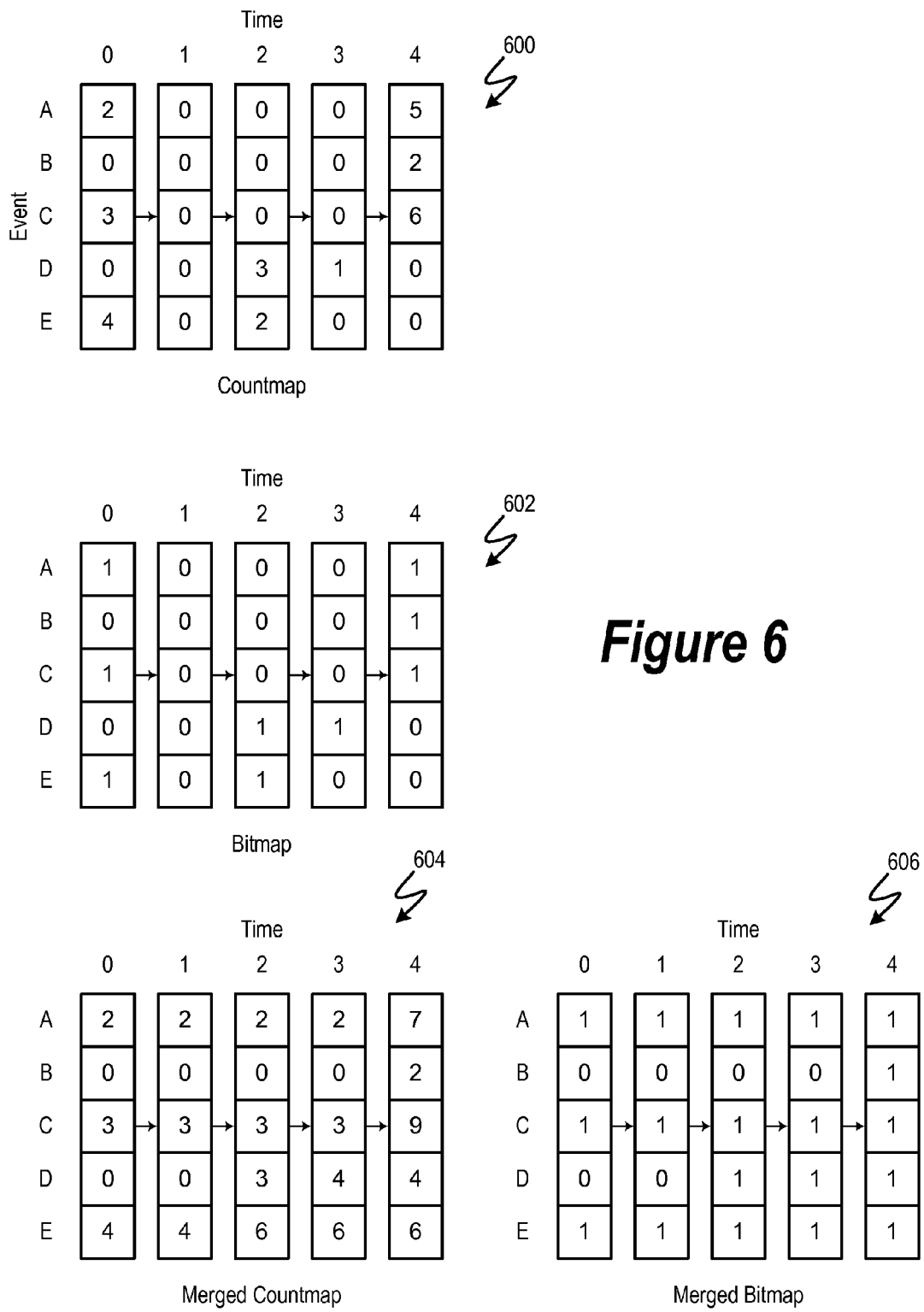
FIG. 6 is a diagram illustrating a bitmap, countmap, merged bitmap, and merged countmap generated by a preferred embodiment of the present invention.

Along with dictionary/checksum 118, a description of a test pattern 120 (including any initial state information needed to reproduce the same results as obtained with that test pattern) is provided. Finally, a "bitmap" and/or "countmap" representation 122 of the coverage results obtained with the test pattern is included. A countmap representation is an ordered list of numerical counts of how many times a given event was triggered by the test pattern associated with that packet. Countmap representation 122 is ordered in the same order as dictionary 118, so that the "nth" count in countmap representation 122 corresponds to the "nth" event listed in dictionary 118. An example sequence of countmap representations received over a particular time period by a backend computer is illustrated by countmap chart 600 in FIG. 6, where the columns of the chart represent individual countmap representations received in sequence and the rows correspond to events, with the ordering of the rows/events in each countmap representation corresponding to the ordering of events defined in the dictionary.

Similar to a countmap representation, a bitmap representation is an ordered list of bits, where the "nth" bit is set to "1" if and only if the "nth" event in the dictionary was triggered by the test pattern. A bitmap representation can therefore be stored more compactly than a countmap (by storing eight different bits in each byte, for example), but it can only store a Boolean representation of whether a given event was triggered by a test pattern, rather than a frequency tally, as in a countmap. A sequence of bitmap representations received over a particular time period by a backend computer is illustrated by bitmap chart 602 in FIG. 6. In a preferred embodiment, the user may choose which representations to generate and transmit to backend computer 112 depending on whether the user wishes to collect frequency data or not.

Backend computer 112 collects the packetized information, combines and analyzes the collected information, and stores its results in non-volatile store 114. These results may be assembled into a human-readable report 116 for use by a test engineer. FIGS. 3-7 describe various ways in which these results may be assembled and/or combined.

Figure 2:
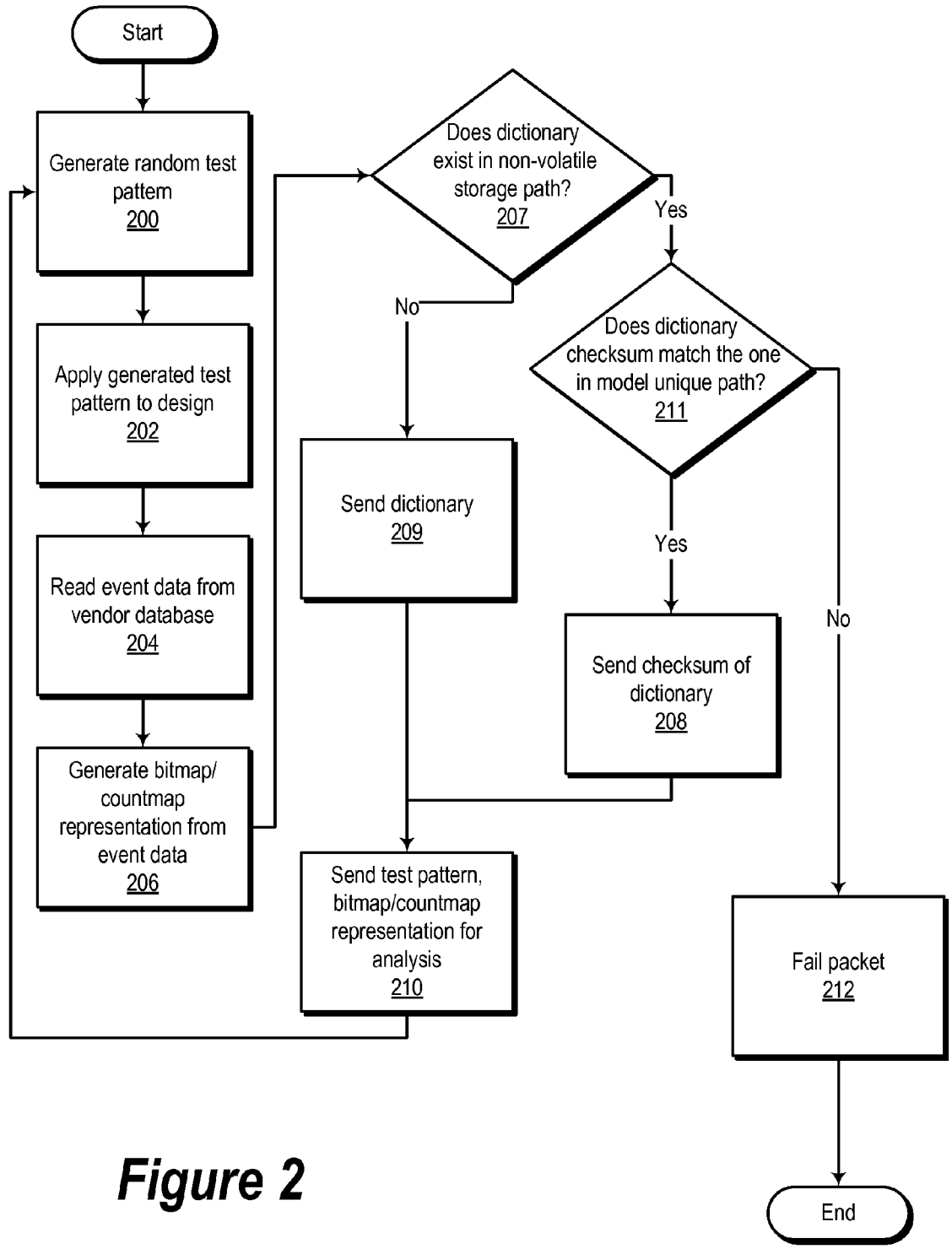
FIG. 2 is a flowchart representation of an overall process of generating test patterns and producing coverage information regarding those test patterns in accordance with a preferred embodiment of the present invention.

FIG. 2 is a flowchart representation of an overall process of generating test patterns and producing coverage information regarding those test patterns in accordance with a preferred embodiment of the present invention.

Test cases are generated from a regression and random test pattern generation. If the test cases are generated by regression, they will be run on all or part of set of tests that are already prepared. If the tests are generated as a random test pattern generation, then an almost unlimited set of tests can be generated to look for the events being accumulated.

The difference between regressions and random test cases is that the generation of a test case is only required for the randomly generated test pattern and an unlimited number of test cases may be generated, whereas the regression needs to run only a finite number of test cases. The means of determining if another test case will be run is dependent on whether the regression is complete, or the results are sufficient. Typically the entire regression may be run, as it has been autograded (had its test cases minimized) to just the test cases that find at least one new event that all the other saved test cases could not find. Random test cases are typically run until a new model is created or the cost of running the test cases does not equal the benefit of seaching for more events.

Turning now to the specific steps described in FIG. 2, a random test pattern (or sequence) is first generated (block 200). This randomly-generated test pattern is then applied to the design under test using appropriate vendor or customer tools for design emulation (block 202). The results of applying the test pattern to the design under test, which indicates the events that were triggered by that test pattern, is then read from the vendor tools' database(s) or customer tools' database(s) (block 204). From those results, bitmap and/or countmap representation(s) of those results are generated (block 206).

Unique model identifier 117 (FIG. 1) is used to construct the location (pathname) of the dictionary, whether or not it exists already. This location is tested for existence (block 207). If it does not exist (i.e., this is the first time to generate/send a test pattern) (block 207: No), then the dictionary is sent to the backend computer (block 209). If the dictionary exists in its corresponding path in non-volatile store 114 (block 207: Yes), however, then a checksum of the dictionary (e.g., in the form of an MD5 or SHA1 hash value) is computed and compared the checksum in the non-volatile storage path (block 211). If the checksums match (block 211: Yes), the checksum of the dictionary is sent to the backend computer (block 208). If not (block 211: No), then packet generation fails (block 212) and the process aborts.

Once either the dictionary or its checksum has been transmitted to the backend computer, the test pattern (and whatever other state information is needed to recreate the results) and the bitmap or countmap representation(s) are then sent to the backend for analysis (block 210) before the process cycles back to block 200 to generate another test pattern. This process continues until a sufficient number of random or regression-generated test patterns have been created.

From a series of countmaps (countmap chart 600) or bitmaps (bitmap chart 602), a merged countmap (merged countmap chart 604) or merged bitmap (merged bitmap chart 606), respectively, may be generated by backend computer 112. Merged countmaps 604 are derived from countmaps 600 by computing a cumulative vector sum of countmaps 600 as they are received. Thus, the merged countmap value at each point in time is the vector sum of all countmaps received up to that point in time. Hence, in FIG. 6, the third column (t=2) of merged countmap chart 604 is the vector sum of the first three columns (t=0 through t=2) of countmap chart 600.

Merged bitmaps (merged bitmap chart 606) combine values cumulatively as in merged countmaps (merged countmap chart 604), except that Boolean values (more specifically, bits) are stored, rather than count values. A merged bitmap is the cumulative bitwise-OR of all bitmaps received up to that point in time. Hence, in FIG. 6, the third column (t=2) of merged bitmap chart 606 is the bitwise-OR of the first three columns (t=0 through t=2) of bitmap chart 602.

Merged bitmap and merged countmap information is useful because it allows one to determine which events were triggered or not triggered by the entire set of test patterns so far generated. This makes it possible for test patterns to be continuously generated until a desired number of events are covered. If the randomly-generated patterns thus obtained fail to cover all events it is desired to cover, the merged countmap or bitmap information can be reported to a test engineer (e.g., report 116 in FIG. 1) so that test patterns covering those events can be manually created. Merged countmap information can additionally provide a test engineer with information about how frequently certain events occur.

Figure 3:
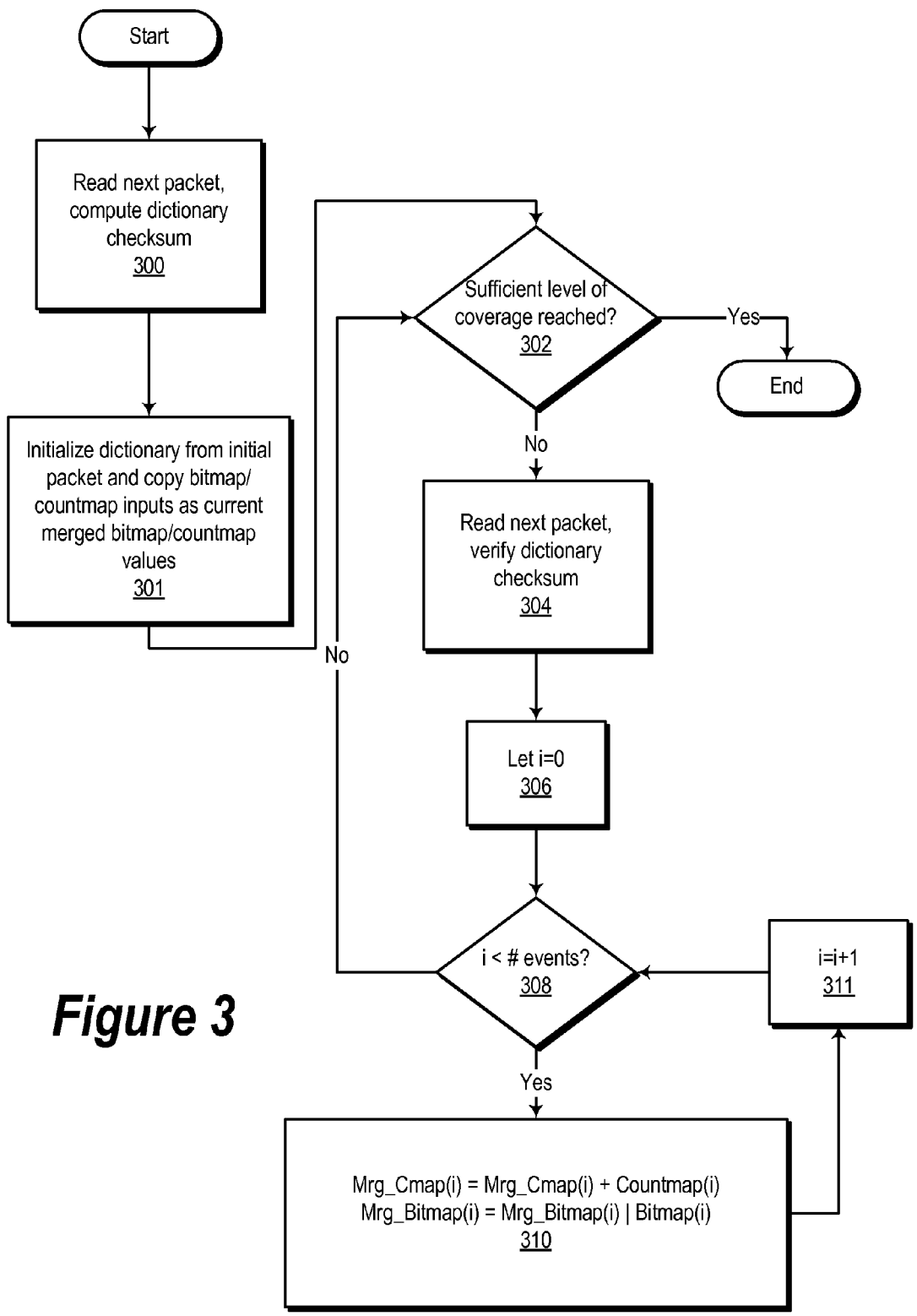
FIG. 3 is a flowchart representation of a process of generating merged countmap and/or merged bitmap data structures in accordance with a preferred embodiment of the present invention.

FIG. 3 is a flowchart representation of a process of generating merged countmap and/or merged bitmap data structures in accordance with a preferred embodiment of the present invention. FIG. 3 begins with the reception of the first packet, for which a checksum is computed (block 300). Next, the backend's representation of the dictionary, merged countmap, and/or merged bitmap are copied from the dictionary, countmap, and bitmap of the first-received packet, respectively (block 301). Next, a determination is made as to whether a sufficient level of coverage has been reached (block 302)—in other words, it is determined whether a desired percentage of the possible events have been covered. This can easily be determined by computing the "norm" of the bitmap, which is defined as the number of one bits present in the bitmap (equivalently, the number of non-zero entries in the countmap). The norm can be divided by the total number of bits in the bitmap (equivalently, the number of entries in the countmap) to construct a coverage percentage. In a preferred embodiment, sufficient coverage has been reached when the coverage percentage reaches a predetermined threshold percentage.

If a sufficient coverage level has not yet been reached (block 302: No), the next packet from a frontend computer is read and its dictionary checksum is verified to ensure a match with an existing dictionary in non-volatile storage (block 304). Then, a loop counter variable "i" is initialized to "0" (block 306). Variable "i" is used to construct a counted ("for") loop over the set of events in the dictionary: if "i" is less than the number of events in the dictionary (block 308: Yes), then the loop body is executed to generate values for the merged countmap and merged bitmap (block 310). Specifically, for the current row (i), referring to the "ith" event (starting from i=0), the value of the merged countmap at that row (i.e., Mrg_CMap(i)) will be the sum of the corresponding value from the currently received countmap and the current value of Mrg_CMap at that location (i.e., Countmap(i)+Mrg_CMap (i)). The value of "i" is then incremented (block 311) and the loop continues (block 308). If "i" is not less than the number of events (block 308: No), the process returns to block 302 to determine if a sufficient level of coverage has been reached (block 302). If a sufficient level of coverage has been reached (block 302: Yes), then the process of FIG. 3 terminates.

The bitmaps or countmaps received by the backend computer may also be used to perform "autograding" of the test coverage results. "Autograding" is a method of minimizing the number of test patterns needed to cover all of the events (or at least all of the events covered by existing test patterns). This problem of minimizing the number of test sequences needed to obtain coverage of all coverable events is an instance of the "MINIMUM COVER" problem in Computer Science, which is known to be NP-Complete (see M. R. GAREY & D. S. JOHNSON, *Computers and Intractability: A Guide to the Theory of NP-Completeness*, New York: W. H. Freeman & Co., 1979, p. 222.) In a nutshell, this means that there is no known way to construct an algorithm that is guaranteed to produce an optimal solution to the problem in polynomial time. Nonetheless, problems such as MINIMUM COVER can often be solved in practice, if one is willing to accept a solution that may not be the absolute optimal solution. This approach is generally referred to as using an "approximation algorithm."

A preferred embodiment of the present invention applies such an approximation algorithm to the problem of minimizing the number of test sequences needed to obtain complete coverage. Thus, by "minimize," it is meant only that the number of test sequences is reduced, since the solutions so obtained may not be the absolute optimal solution. For practical purposes, however, the solutions obtained by the algorithm employed in a preferred embodiment of the present invention will be more than adequate. This approximation algorithm runs in time O(mn), where "m" is the original number of test sequences and "n" is the number of triggerable events.

Figure 7:
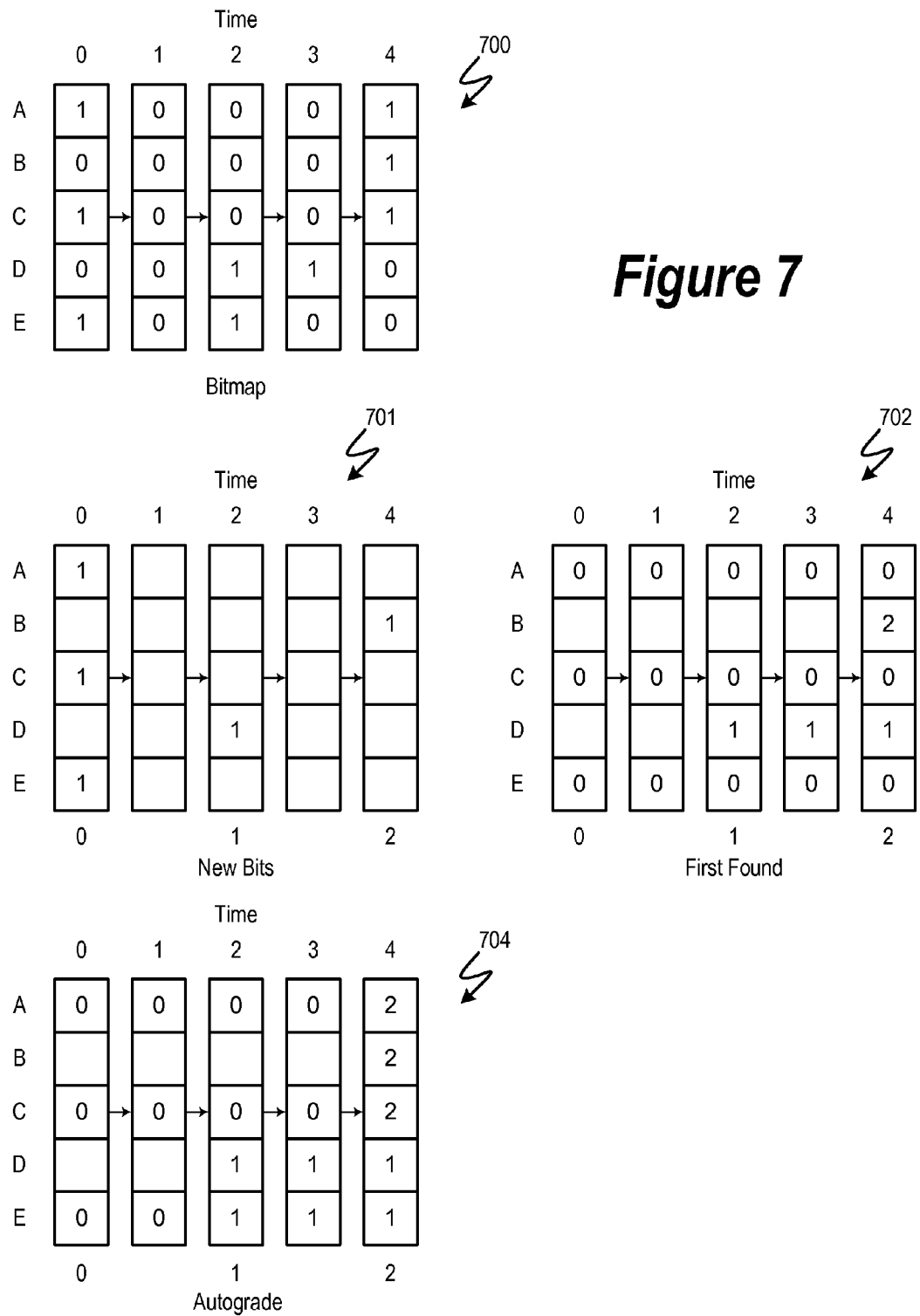
FIG. 7 is a diagram illustrating data structures generated in a process of autograding a set of test sequences in accordance with a preferred embodiment of the present invention

FIG. 7 illustrates the various data structures employed in autograding a set of test sequences in accordance with a preferred embodiment of the present invention. From each of a series of bitmap or countmap test pattern results (bitmap chart 700 in FIG. 7), "new bits" and "first found" vectors (corresponding columns in new bits chart 701 and first found chart 702, respectively) are generated. The entries in new bits vectors (chart 701) are bits that represent events that were first triggered by the test pattern corresponding to a particular column (as received in sequence). Those entries that are empty in chart 701 (and charts 702 and 704, as well) are undefined (e.g., "undef" in the Perl programming language). For example, in FIG. 7, new bits chart 702 shows that event D is first triggered by the test pattern received at time 2, since there is a "1" entry in row D, column 2.

The first found vectors (chart 702) contain analogous entries to the new bits vectors (chart 701), except that instead of marking each newly covered event with a bit, the entries in each first found vector correspond to a renaming of the test sequences that triggered events not already triggered by previous test sequences. Thus, in first found chart 702, the test patterns received at times t=0, t=2, and t=4 are renamed saved test case numbers 0, 1, and 2, respectively, under this scheme. The purpose of the renaming is to keep the index of the saved test case number to a number less than or equal to the number of events overall, thus 2 raised to the power of 32 test cases still fit in one unsigned integer, even if the actual number of test cases processed far exceeds that, and similarly. if a 16 bit number is being used to store the index because the number of test cases is less than 2 raised to the 16, the index will still fit, even if 2 to the 20 testcases are actually processed to find those events. It is expected that only a relatively small percentage of test cases will yield new events, so this renaming is useful to keep the data structures small.

Thus, in the example provided in FIG. 7, the entries for events A, C, and E at time t=0 are marked with "0," the entry for event D at time t=2 is marked with a "1," and so on. First found vectors (chart 702) can thus be used to reduce the number of test patterns needed by eliminating those test patterns that do not yield new events—i.e., those test patterns for which there are no entries in its new bits vector (such as with the test cases 1 and 3 in FIG. 7).

The autograde vector (chart 704) represents the results of applying "autograding" to further minimize the number of test patterns required. Under the autograding procedure employed by a preferred embodiment of the present invention, each time a test pattern that yields new events is discovered, that test pattern is recorded in the autograde vector (chart 704) not only as the test pattern that yielded those new events (as in first found vectors 702), but also as the designated triggering test pattern for all other events triggered by that test pattern.

Thus, in FIG. 7, the autograde vector (chart 704), at time t=0, records events A, C, and E as being triggered by test pattern 0, but then at t=2 labels both events D and E as being triggered by test pattern 2 (which has been renamed test sequence 1 in the first found vector (chart 702)). Likewise, at time t=4, events A, B, and C are labeled as being triggered by test pattern 4 (renamed test sequence 2), since A, B, and C are all triggered by that test pattern.

The end result of this autograding is a further reduction in the number of test patterns required over those identified by the first found vectors (chart 702). As shown at t=4 in chart 704, the entire set of covered events may be triggered using only test patterns 2 and 4 (renamed test sequences 1 and 2, respectively). Hence, only these two test patterns need be retained for subsequent use.

The autograde vector (chart 704) and the first found vectors (chart 702) are useful not only for reducing the number of test sequences that must be utilized to obtain full event coverage, but they are helpful analytical tools in their own right. For example, a test engineer wishing to devise a test sequence that triggers an as-yet non-covered event can look to the autograde vector (chart 704) and first found vectors 702 to see which test sequences triggered related events and to determine what aspects of those test sequences, as compared to other test sequences that did not trigger those events, appear to cause those events to be triggered. From this information, a test engineer can modify existing test sequences or derive new test sequences that trigger other non-covered events related to those events already covered.

Figure 4:
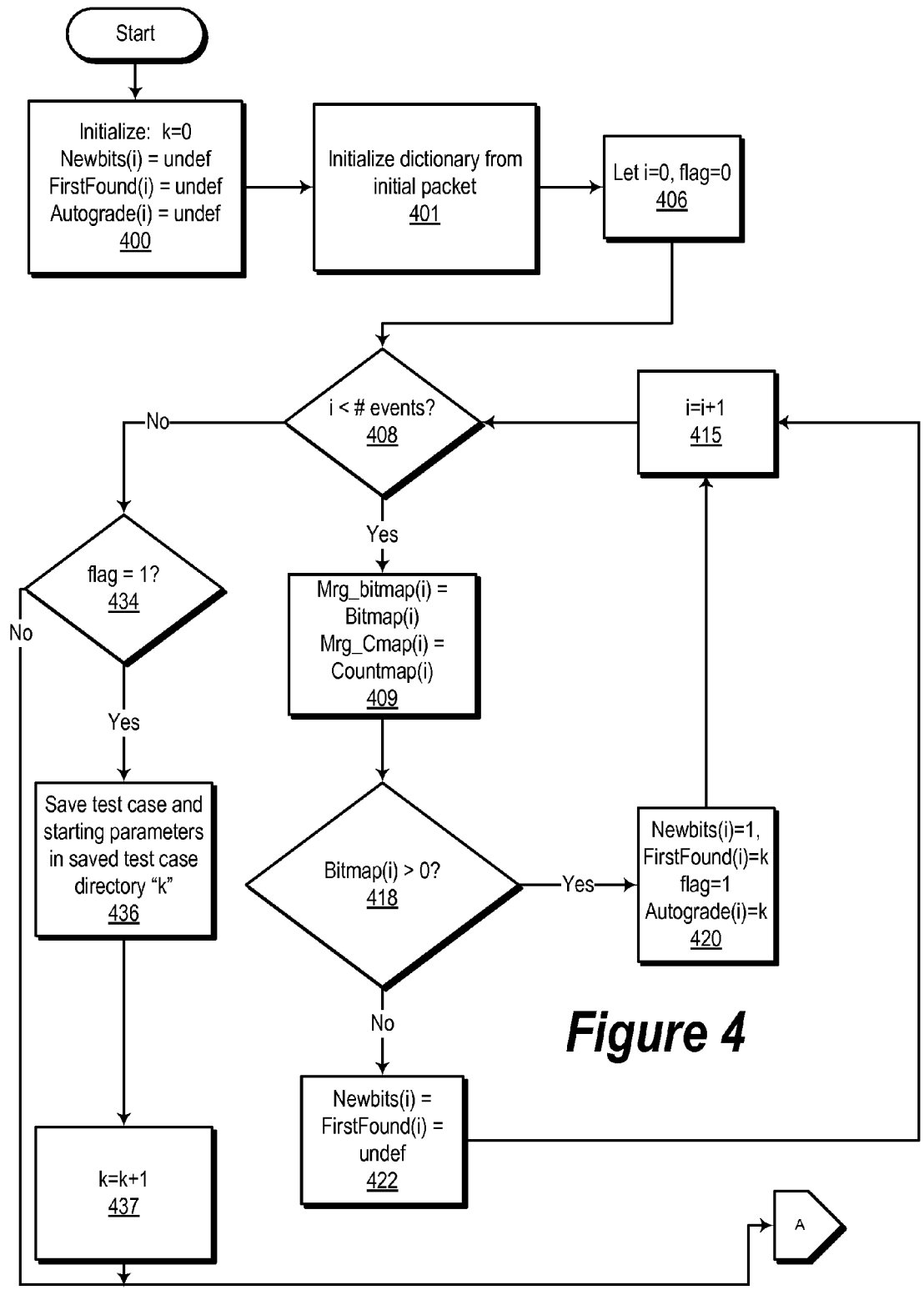
FIGS. 4 and 5 together provide a flowchart representation of a process of performing autograding on a set of test sequences to obtain a minimized set of a covering test sequences in accordance with a preferred embodiment of the present invention.
Figure 5:
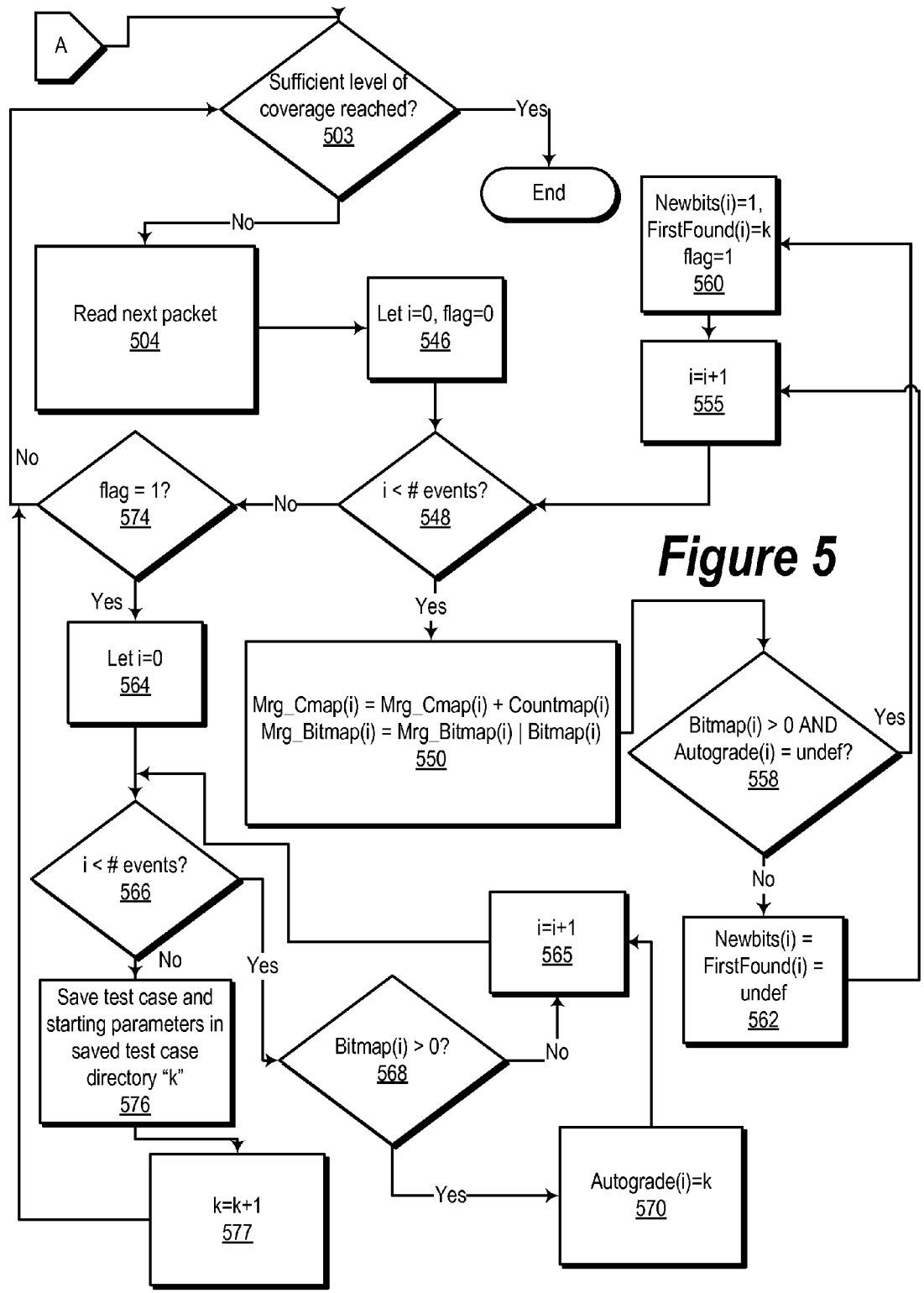

FIGS. 4 and 5 are together a flowchart representation of a process of performing autograding on bitmap representations (or alternatively on countmap representations) of coverage data along with generating a merged bitmap and/or merged countmap in accordance with a preferred embodiment of the present invention. First, a relabeling counter "k" is initialized to zero and the "Newbits," "FirstFound," and "Autograde" data structures are set to a value of "undefined" (block 400). As a convention in FIGS. 4 and 5, the value "undef" is used to denote "undefined" as is the case in the Perl programming language. Then, the backend's representation of the dictionary is copied from the dictionary contained in the first-received packet (block 401). Next, a loop counter variable "i" is initialized to zero and a Boolean flag, "flag," is set to false (or zero, in languages such as C and Perl, which encode Booleans as integers) (block 406).

At block 408 a "for" loop is defined. If "i" is less than the total number of events in the dictionary (block 408: Yes), then the values of Bitmap(i) and Countmap(i) are copied into merged bitmap entry Mrg_bitmap(i) and merged bitmap entry Mrg_Cmap(i), respectively (block 409). A determination is made as to whether the current bitmap (i. e., that received from the most recently received packet) yields the "ith" event for the first time (block 418). Specifically, if Bitmap(i) >0 (meaning that event "i" is triggered by the current test pattern) (block 418: Yes), Newbits(i) is set to 1, FirstFound(i) is set to the value of "k" (with "k" being the next name to be used in renaming the test sequences), "flag" is set to 1 (true) to indicate that the current test sequence yields new events (new bits), and Autograde(i) is set to the value of "k" (block 420). If event "i" was not triggered by the current test pattern(block 418: No), Newbits(i) and FirstFound(i) are set to undef (block 422). This loop continues its "new bits" determination by incrementing "i" (block 415) and retesting the loop condition at block 408.

Following the termination of this first loop (block 408: No), "flag" is then tested for truth (block 434). If "flag" reads true (block 434: Yes), then starting parameters and whatever test pattern information needed to recreate the same results is then recorded (for subsequent use) (block 436). Preferably, this test pattern and state information will be stored in some kind of indexed arrangement, such as in a file that is located in a directory that has a name based on the label ("k") of the current test pattern. For example, a test pattern labeled "104" could be stored in a hierarchical directory "00/00/01/04" (creating a multi-level directory structure based on groups of digits, in this way, enhances the efficiency of locating a given test pattern). After the test pattern information is stored, "k" is incremented (block 437). The maximum number of the digits in k can be computed from the decimal representation of the number of digits in the size of the dictionary. Since the dictionary is fixed by the first testcase, this maximal number of digits can be determined at the time of the first testcase being processed.

Following block 437, or if "flag" was false at block 434, execution proceeds to block 503, where a determination is made as to whether a sufficient level of coverage has been reached (as discussed above in connection with the calculation of "norm" and "coverage percentage"). If a sufficient coverage level has not yet been reached (block 503: No), the next packet from a frontend computer is read (block 504). Next, a loop counter variable "i" is initialized to zero and a Boolean flag, "flag," is set to false/zero(block 546).

At block 548 a for loop is defined. If "i" is less than the total number of events in the dictionary (block 408: Yes), then the loop body is executed to generate values for the merged countmap and merged bitmap (block 550). Specifically, for the current row (i), referring to the "ith" event (starting from i=0), the value of the merged countmap at that row (i.e., Mrg_CMap(i)) will be the sum of the corresponding value from the currently received countmap and the current value of Mrg_CMap at that location (i.e., Countmap(i) + Mrg_CMap (i)). Next, a determination is made as to whether the current bitmap (i. e., that received from the most recently received packet) yields the "ith" event for the first time (block 558). Specifically, if Bitmap(i) >0 (meaning that event "i" is triggered by the current test pattern) and Autograde(i)=undef, meaning that no previously considered test sequence has triggered that event (block 558: Yes), then Newbits(i) is set to 1 and FirstFound(i) is set to the value of "k" (with "k" being the next name to be used in renaming the test sequences from their original sequence number "j" to a saved test case number "k") and "flag" is set to 1 (true) to indicate that the current test sequence yields new events (new bits) (block 560). If not (block 558: No), Newbits(i) and FirstFound(i) are set to undef (block 562). This loop continues by incrementing "i" (block 555) and retesting the loop condition at block 548.

Following the termination of this first loop (block 548: No), "flag" is then tested for truth (block 574). If "flag" reads true (block 574: Yes), setup for a second loop is made at block 564 by re-initializing the loop counter "i" to zero. The second loop is started at block 566 to modify the Autograde vector. If "i" is less than the number of events (block 576: Yes), the loop body is executed and a determination is made as to whether to record the current test sequence at the current location in the Autograde data structure (block 568). Specifically, if Bitmap (i) >0 (meaning that the current test pattern triggered event "i") (block 568: Yes), then Autograde(i) is set to the value of "k" (block 570). If not (block 568: No), then the value of Autograde for the current row remains the same. The loop counter variable "i" is then incremented (block 565) and the loop condition retested at block 566.

Following the termination of this second loop, the saved testcase number is set to the value "k" to denote that test sequence "j," which corresponds to "time" in diagram 701 in FIG. 7, has been renamed "k" as in the example provided FIG. 7, and state information and test pattern information needed to recreate the same results is then recorded (for subsequent use) (block 576). Then "k" is incremented (block 577).

Following block 577 or if "flag" was false (block 574: No), the process returns to block 503 to determine if a sufficient level of coverage has been reached. If a sufficient level of coverage has been reached (block 503: Yes), then the process of FIGS. 4-5 terminates.

As mentioned above, in some instances, test coverage results achieved with respect to one design/model may be of value to another design/model. For example, an engineer may originally write one hundred coverage events, build a model with those events and collect coverage using the methods described above. Then, the engineer might add several more events and build another model including these new events. Because the two models represent the same overall design (for a circuit, machine, computer program, etc.), it would be useful to be able view coverage results for these two models together without actually combining the models themselves and generating all new test patterns to replace those generated for the first model.

There are other scenarios where the ability to merge coverage results from different models would be beneficial. For example, an engineer may realize that some of the coverage events in a model are impossible and then build a new model where these impossible events commented out. In that case, it would be beneficial to merge the coverage results for a new model with the original set of results obtained using the original model.

In some cases, the actual underlying designs being tested by different models may differ, but nonetheless be related enough so that testcases developed for one design will trigger the same events on another design. An example of this would be single-core and multi-core versions of a microprocessor. If testcases are separately generated for each design, it would be beneficial to be able to combine the coverage results to see if the combined set of testcases would completely cover all desired events, since each separately generated testcase set may by itself only cover a subset of the desired events.

Yet another practical application for combining test coverage results is in a verification environment where verification is performed on a unit-level as well as a global level. Unit verification models can have all coverage events coded by unit verification engineers. Each of these models may contain thousands of events. At the chip level, a model with only a few selected events from every unit is normally used. However, it would be useful to report merged coverage results for the unit-level models and chip-level model so as to report the overall coverage for the chip.

Figure 8:
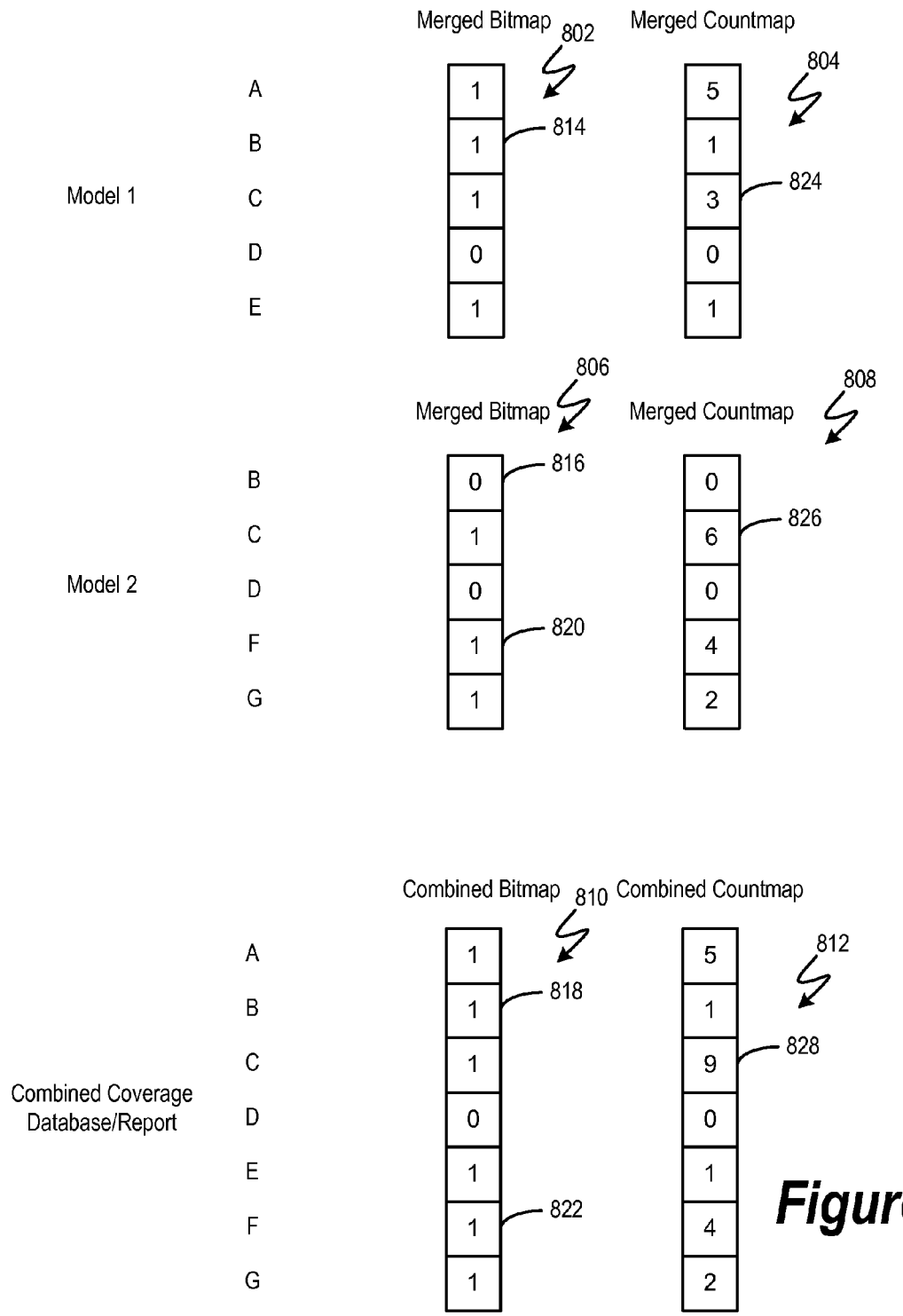
FIG. 8 is a diagram illustrating data structures generated in a process of producing a combined test coverage report across a plurality of designs in accordance with a preferred embodiment of the present invention.

This combined coverage reporting is achieved in a preferred embodiment of the present invention by combining of the bitmap and countmap coverage in the manner shown in FIG. 8. In FIG. 8, merged bitmap and merged countmap data structures are shown for two different models. Merged bitmap 802 and merged countmap 804 correspond to a first model ("Model 1"), while merged bitmap 806 and merged countmap 808 correspond to a second model ("Model 2"). For Model 1, test coverage results for events "A," "B," "C," "D," and "E" have been collected, while for Model 2, test coverage results for events "B," "C," "D," "F," and "G" have been collected.

From these two sets of results, a combined report containing merged bitmap 810 and merged countmap 812 is generated. Merged bitmap 810 and merged countmap 812 contain coverage information for the events pertaining to both models (i. e., the set-wise union of events from the two models). Merged bitmap 810 is obtained by performing a logical-or of results from bitmaps 802 and 806 pertaining to the same events. For example, since value 814 in bitmap 802 and value 816 in bitmap 806 both correspond to the same event (event "B"), the combined report bitmap entry 818 in bitmap 810 reads "1," which is the logical-or of the value 814 and 816. Events that do not pertain to a particular model are considered to have a bitmap value of zero for this purpose "0." Hence, bitmap value 822 in bitmap 810 (corresponding to event "F") is the logical-or of value 820 (from bitmap 806) and an implied value of "0" from bitmap 802, since event "F" does not pertain to "Model 1." Similarly, merged countmap 812 is generated by adding corresponding countmap values for events. Thus, countmap value 828 (corresponding to event "C") in bitmap 812 (value of 9) is the sum of values 824 and 826 (3 and 6, respectively).

Figure 9:
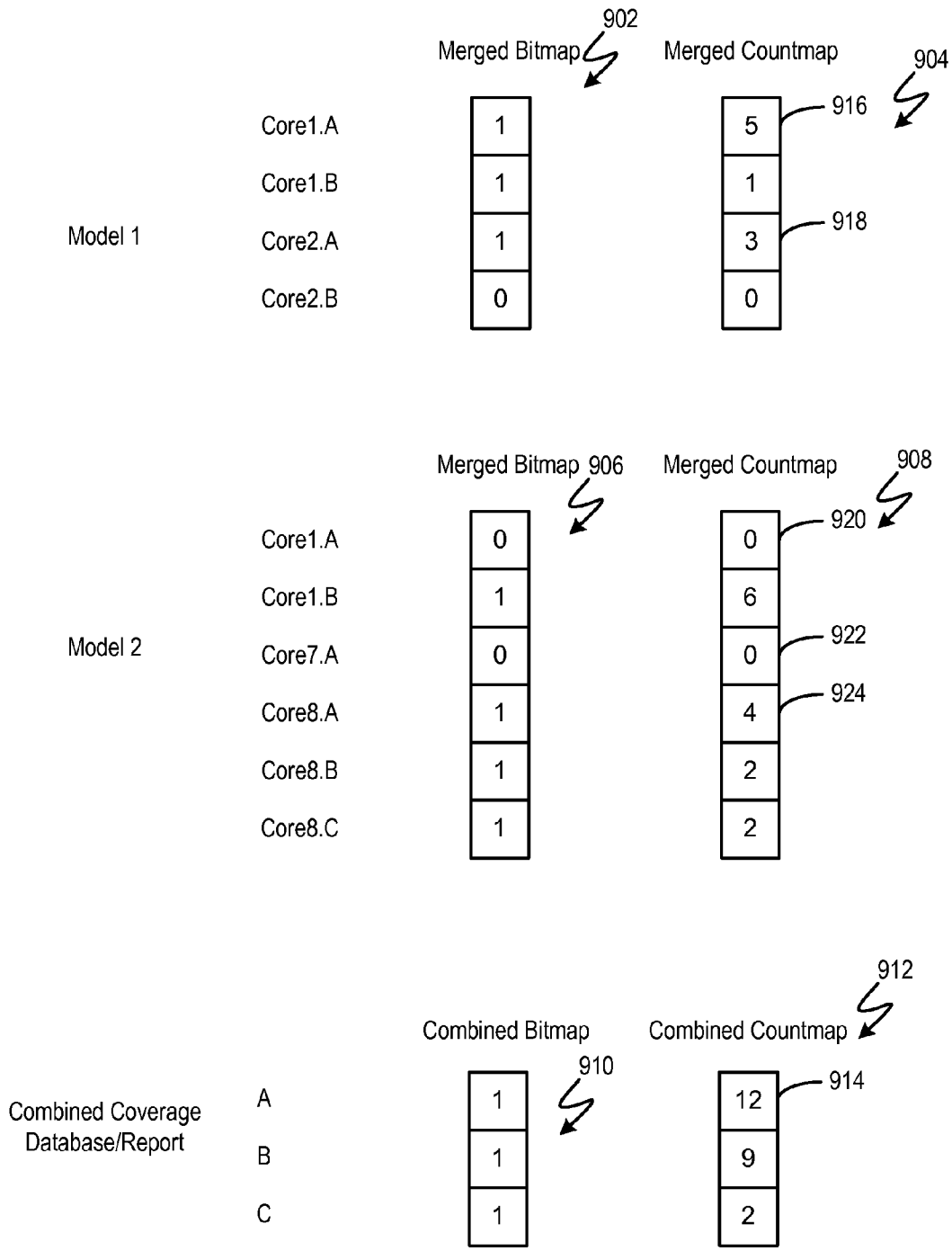
FIG. 9 is a diagram illustrating data structures generated in a process of producing a combined test coverage report across a plurality of designs having multiple instances of particular components in accordance with a preferred embodiment of the present invention.

An additional refinement of the method describe in FIG. 8 is illustrated in FIG. 9. As suggested above, a given design may contain multiple instances of a given component. For example, a multi-core processor contains multiple instances of a single processor core. In such cases, triggering an event on one of the instances may be sufficient to verify the design of all of the instances. Thus, a further consolidation of results between component instances may be beneficial.

In FIG. 9, bitmap 902 and countmap 904 correspond to "Model 1," a dual-core processor in which events "A" and "B" are detectable in both cores. Thus, in the dictionary of events corresponding to "Model 1," there are actually four events, "Core1.A," "Core1.B," "Core2.A," and "Core2.B," each of which corresponds to a particular type of event occurring in one of the two cores-thus, each event name contains a hierarchical instance component and a base-name component. Similarly, bitmap 906 and countmap 908 correspond to "Model 2," a multi-core processor in which events "A," "B," and "C" are detectable in a subset of the cores. Combined coverage information is generated in the form of bitmap 910 and countmap 912, which contain entries corresponding only to the base event types, "A," "B," and "C." Bitmap 910 and countmap 912 are formed by performing the logical-or operation or addition operation, respectively, over all bitmap/countmap entries for a given base event type. For example, value 914 in countmap 912 (value of 12) is the sum of values 916, 918, 920, 922, and 924 (each of which corresponds to the same base event type "A," albeit in different models and different subcomponents (in this case, processor cores) in those models. Bitmap 910 is generated similarly, except that the logical-or operation is used to combine bitmap entries, rather than addition, as was used for combining countmap entries.

The combined reporting information obtained through the processes described in FIGS. 8 and 9 can be used to generate a plain-text report for subsequent engineering use, as with the results obtainable in the single-model case.

In a preferred embodiment of the present invention, additional options for defining the manner in which test coverage results are combined may be specified. In FIG. 8, for instance, the combined coverage results included entries for each event in the set-wise union of events across the plurality of models (i.e., since the set of events associated with Model 1 was {A, B, C, D, E} and the set of events associated with Model 2 was {B, C, D, F, G}, the combined coverage database contained entries for the union of these two sets, namely, {A, B, C, D, E, F, G}). In a preferred embodiment of the present invention, the combined coverage results may alternatively be assembled over the set-wise intersection of events instead (i.e., where the combined coverage database contains entries for only those events that pertain to all of the models from which coverage results were combined). Alternatively, one of the models may be designated as a "base model" and the combined coverage results assembled so that only events that pertain to the base model have entries in the combined coverage database. This last option may be especially useful in a case where there exists a "global model" or "chip-level model" that shares a number of events with individual unit-level models, since it allows coverage results from unit-model testcases that happen to refer to events also pertaining to the global model to be combined with the global model coverage results without having to report coverage results for all unit-level events.

Figure 10:
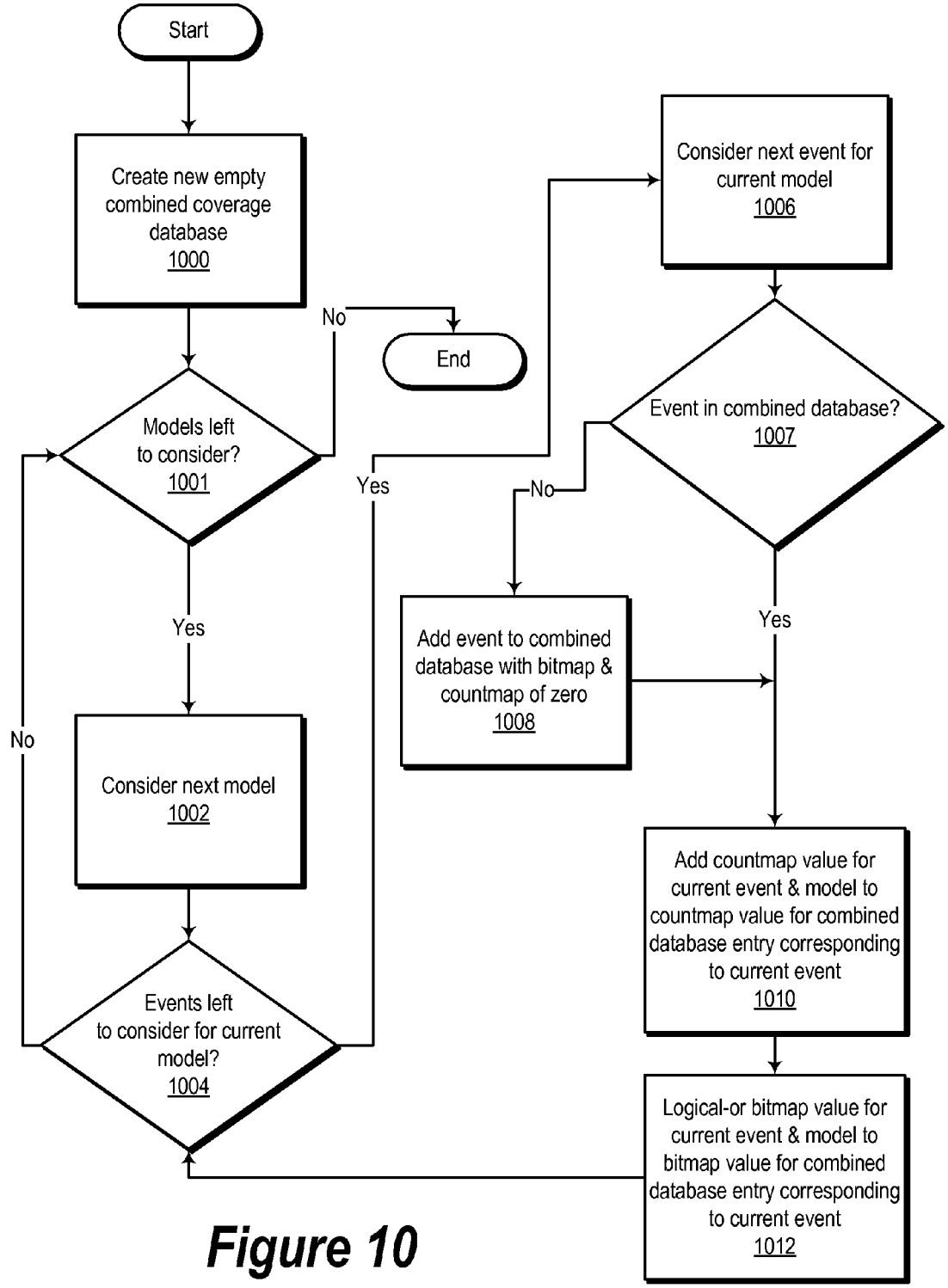
FIG. 10 is a flowchart representation of process of producing a combined test coverage report across a plurality of designs in accordance with a preferred embodiment of the present invention

FIG. 10 is a flowchart representation of a process of merging test coverage information in accordance with a preferred embodiment of the present invention. The process begins with the creation of a new empty test coverage database to refer to the combined test coverage information from multiple models, the empty coverage database containing an event dictionary, bitmap, and countmap data structures as in FIGS. 8 and 9 (block 1000). If there are models whose test coverage results have yet to be merged into the combined report (block 1001: Yes), execution proceeds to block 1002, where the next model is selected for consideration. If there are events for the current model left to be examined (block 1004: Yes), the next such event is selected for consideration (block 1006). If this event does not have a corresponding entry in the combined coverage information database (block 1007: No), then such an entry is generated with bitmap and countmap values set to zero (block 1008) before continuing on to block 1010.

Next, the countmap value for the current model and event under consideration is added to the countmap value in the corresponding database entry for the particular event in the combined coverage information database (block 1010). Similarly, the bitmap information for the current model and event is logical-or'ed to the bitmap value for the corresponding database entry for the particular event in the combined coverage information database (block 1012). Processing then returns to block 1004 to determine if additional events have not been examined for the current model. If not (block 1004: No), the inner loop formed by block 1004 terminates, and processing returns to block 1001 to determine if additional models have yet to be examined. If not (block 1001: No), the process of FIG. 10 terminates, with the combined coverage results being contained in the new combined coverage database (originally generated at block 1000).

As demonstrated in FIG. 11, test coverage autograde results can be combined in a similar fashion to enable a combined set of testcases to be organized covering all as-of-yet-detectable events. In the example illustrated in FIG. 11, autograde vector 1110 represents autograde results obtained for a first model ("Model 1"). Autograde vector 1102 represents autograde results obtained for a second model ("Model 2"). Recall that the results contained in autograde vectors 1100 and 1102 represent a minimized set of testcases that, when applied to the design under test, trigger each of the events represented in the vector. Since, in FIG. 11, there are two models, the identifiers of the testcases are written in a hierarchical form to distinguish testcases corresponding to Model 1 (which are written "1.1," "1.2," etc.) from testcases corresponding to Model 2 (which are written "2.1," "2.2," etc.).

Autograde results from autograde vector 1100 and 1102 are merged into a combined autograde vector 1104 by sequentially incorporating testcases from vector 1100 and vector 1102 so that all events are covered. In this example, the results from autograde vector 1100 (which demonstrate coverage of events A-E) are first incorporated wholesale into autograde vector 1104. Thus, according to this example, testcases 1.1, 1.2, 1.3, and 1.7 are added to autograde vector 1104 in the entries corresponding to events D, E, A, B, and C. Autograde vector 1102 is then examined, but only testcases corresponding to events not covered by the testcases in autograde vector 1100 are added to autograde vector 1104. Thus, since only events F and G were not covered in autograde vector 1100, only the testcases from autograde vector 1102 for events F and G (testcases 2.5 and 2.8, respectively) are copied into combined autograde vector 1104. One skilled in the art will recognize that this process may be repeated for any number of models by copying, at each pass, only those testcases that trigger events not triggered by a testcase generated for a previous model. Also, as was demonstrated in FIG. 9 with respect to the bitmap and countmap data structures, autograde results can be combined over equivalence classes of events (e.g., a testcase that triggers "Event A" in "Core 1" of "Model 1" may be considered to trigger "Event A" generally, so that it is not necessary to include an additional testcase that, for instance, triggers "Event A" in "Core 7" of "Model 2" in the combined autograde vector).

Figure 12:
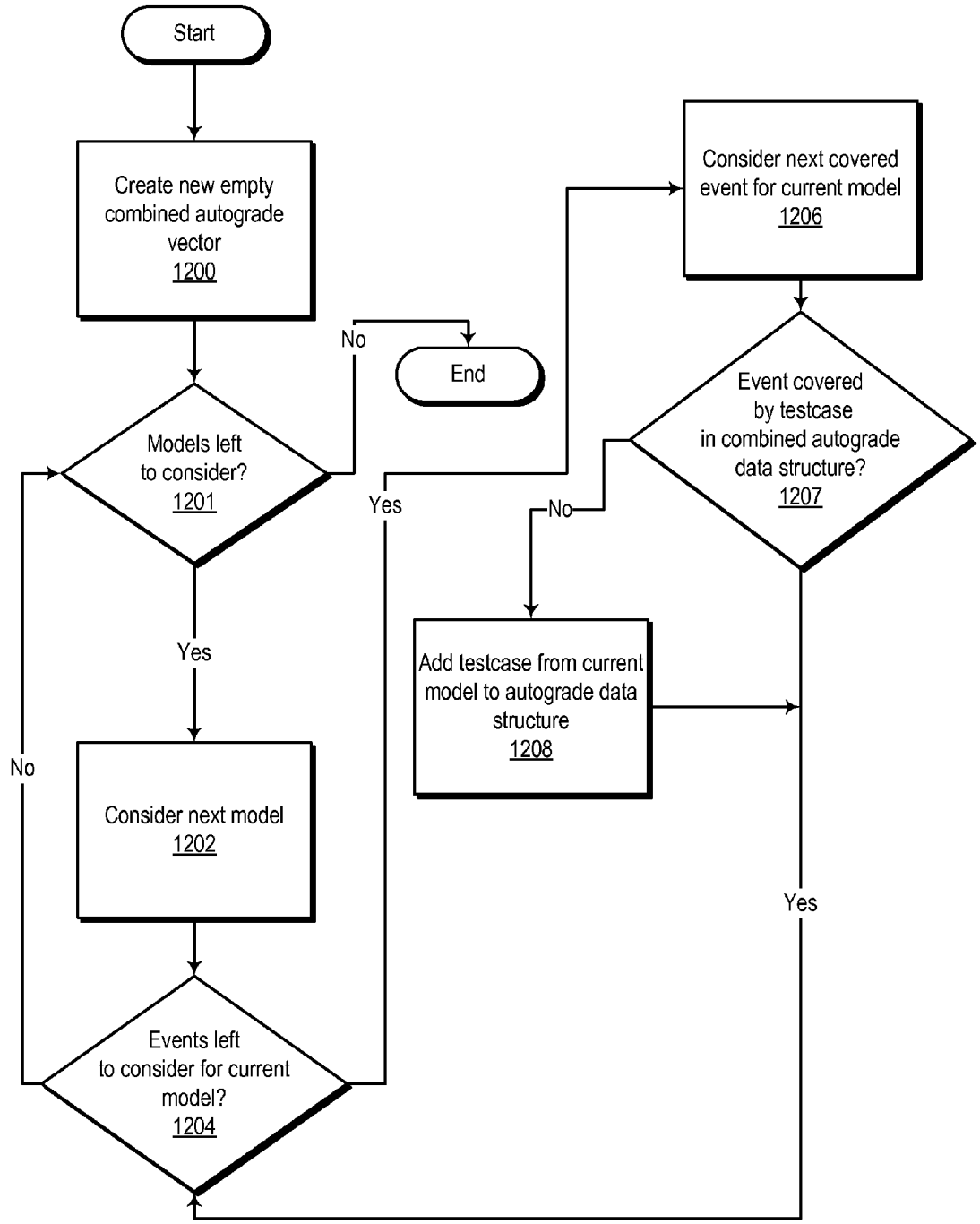
FIG. 12 is a flowchart representation of a process of combining testcase autograde results across a plurality of designs in accordance with a preferred embodiment of the present invention.

The process illustrated in FIG. 11 is depicted in flowchart form in FIG. 12. The process begins with the creation of a new empty combined autograde vector to refer to the combined autograde results from multiple models (block 1200). If there are models whose autograde results have yet to be merged into the combined vector (block 1201: Yes), execution proceeds to block 1202, where the next model is selected for consideration. If there are events for the current model left to be examined (block 1204: Yes), the next covered event (i.e., event covered by a testcase) is selected for consideration (block 1206). If this event does not have a corresponding testcase in the combined autograde vector (block 1207: No), then the testcase for the current model and event is added to the combined autograde vector as the corresponding testcase for the current event (block 1208).

Processing then returns to block 1204 to determine if additional events have not been examined for the current model. If not (block 1204: No), the inner loop formed by block 1204 terminates, and processing returns to block 1201 to determine if additional models have yet to be examined. If not (block 1201: No), the process of FIG. 12 terminates, with the combined coverage results being contained in the new combined coverage database (originally generated at block 1200).

Figure 13:
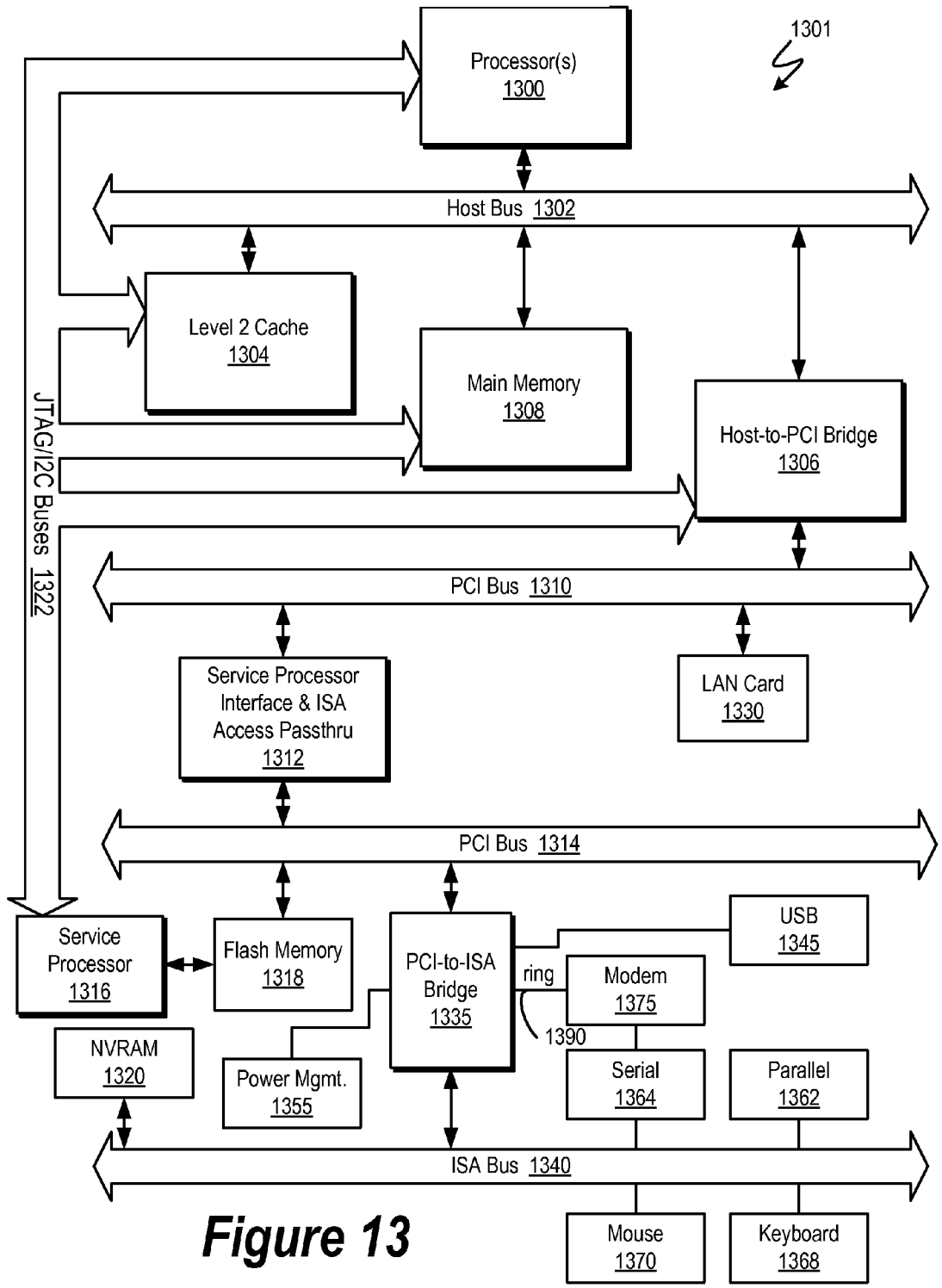
FIG. 13 is a block diagram of a data processing system in which a preferred embodiment of the present invention may be implemented.

FIG. 13 illustrates information handling system 1301 which is a simplified example of a computer system capable of performing the computing operations of the host computer described herein with respect to a preferred embodiment of the present invention. Computer system 1301 includes processor 1300 which is coupled to host bus 1302. A level two (L2) cache memory 1304 is also coupled to host bus 1302. Host-to-PCI bridge 1306 is coupled to main memory 1308, includes cache memory and main memory control functions, and provides bus control to handle transfers among PCI bus 1310, processor 1300, L2 cache 1304, main memory 1308, and host bus 1302. Main memory 1308 is coupled to Host-to-PCI bridge 1306 as well as host bus 1302. Devices used solely by host processor(s) 1300, such as LAN card 1330, are coupled to PCI bus 1310. Service Processor Interface and ISA Access Pass-through 1312 provide an interface between PCI bus 1310 and PCI bus 1314. In this manner, PCI bus 1314 is insulated from PCI bus 1310. Devices, such as flash memory 1318, are coupled to PCI bus 1314. In one implementation, flash memory 1318 includes BIOS code that incorporates the necessary processor executable code for a variety of low-level system functions and system boot functions.

PCI bus 1314 provides an interface for a variety of devices that are shared by host processor(s) 1300 and Service Processor 1316 including, for example, flash memory 1318. PCI-to-ISA bridge 1335 provides bus control to handle transfers between PCI bus 1314 and ISA bus 1340, universal serial bus (USB) functionality 1345, power management functionality 1355, and can include other functional elements not shown, such as a real-time clock (RTC), DMA control, interrupt support, and system management bus support. Nonvolatile RAM 1320 is attached to ISA Bus 1340. Service Processor 1316 includes JTAG and I2C buses 1322 for communication with processor(s) 1300 during initialization steps. JTAG/I2C buses 1322 are also coupled to L2 cache 1304, Host-to-PCI bridge 1306, and main memory 1308 providing a communications path between the processor, the Service Processor, the L2 cache, the Host-to-PCI bridge, and the main memory. Service Processor 1316 also has access to system power resources for powering down information handling device 1301.

Peripheral devices and input/output (I/O) devices can be attached to various interfaces (e.g., parallel interface 1362, serial interface 1364, keyboard interface 1368, and mouse interface 1370 coupled to ISA bus 1340. Alternatively, many I/O devices can be accommodated by a super I/O controller (not shown) attached to ISA bus 1340.

In order to attach computer system 1301 to another computer system to copy files over a network, LAN card 1330 is coupled to PCI bus 1310. Similarly, to connect computer system 1301 to an ISP to connect to the Internet using a telephone line connection, modem 1375 is connected to serial port 1364 and PCI-to-ISA Bridge 1335.

While the computer system described in FIG. 13 is capable of executing the processes described herein, this computer system is simply one example of a computer system. Those skilled in the art will appreciate that many other computer system designs are capable of performing the processes described herein.

One embodiment of the invention is a client application, namely, a set of instructions (program code) or other functional descriptive material in a code module that may, for example, be resident in the random access memory of the computer. Until required by the computer, the set of instructions may be stored in another computer memory, for example, in a hard disk drive, or in a removable memory such as an optical disk (for eventual use in a CD ROM) or floppy disk (for eventual use in a floppy disk drive), or downloaded via the Internet or other computer network. Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps. Functional descriptive material is information (instructions or executable code) that imparts functionality to a machine.

In summary, a computer-implemented method, computer program product, and data processing system for merging test pattern coverage results are disclosed. A first test result vector is obtained, the first test vector corresponding to a first set of test patterns applied to a first design under test, wherein the first test result vector indicates coverage of one or more events triggered by the first set of test patterns. Similarly, a second test result vector is obtained, the second test result vector corresponding to a second set of test patterns applied to a second design under test, wherein the second test result vector indicates coverage of one or more events triggered by the second set of test patterns and wherein the one or more events triggered by the second set of test patterns includes one or more of the one or more events triggered by the first set of test patterns. Coverage data are merged together from at least the first test result vector and the second test result vector to obtain a merged event coverage vector, wherein the merged event coverage vector has a length that is less than the sum of the lengths of the first test result vector and the second test result vector, wherein the merged event coverage vector indicates coverage of events triggered by at least the first set of test patterns and the second set of test patterns, and wherein the merged event coverage vector contains a plurality of entries and each of the plurality of entries is a value representing whether a corresponding event was covered.

While particular embodiments of the present invention have been shown and described, it will be obvious to those skilled in the art that, based upon the teachings herein, changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an;" the same holds true for the use in the claims of definite articles.

What is claimed is:

1. A computer-implemented method comprising:
   obtaining a first test result vector corresponding to a first set of test patterns applied to a first design under test, wherein the first test result vector indicates coverage of one or more events triggered by the first set of test patterns;
   obtaining a second test result vector corresponding to a second set of test patterns applied to a second design under test, wherein the second test result vector indicates coverage of one or more events triggered by the second set of test patterns and wherein the one or more events triggered by the second set of test patterns includes one or more of the one or more events triggered by the first set of test patterns; and
   merging coverage data from at least the first test result vector and the second test result vector to obtain a merged event coverage vector, wherein the merged event coverage vector has a length that is less than a sum of lengths of the first test result vector and the second test result vector and wherein the merged event coverage vector indicates coverage of events triggered by at least the first set of test patterns and the second set of test patterns, and wherein the merged event coverage vector contains a plurality of entries and each of the plurality of entries is a value representing whether a corresponding event was covered.

2. The method of claim 1, wherein the merging comprises performing a logical-or of corresponding entries from the first test result vector and the second test result vector to obtain the plurality of entries in the merged event coverage vector.

3. The method of claim 1, wherein the merged event coverage vector contains a plurality of entries and each of the plurality of entries is a numerical value representing a number of times a corresponding event was covered.

4. The method of claim 3, wherein the merging comprises summing corresponding entries from the first test result vector and the second test result vector to obtain the plurality of entries in the merged event coverage vector.

5. The method of claim 1, further comprising:
   obtaining an event dictionary wherein events represented in the first test result vector and the second test result vector are correlated to the event dictionary.

6. The method of claim 1, further comprising:
   combining, into a single value, test coverage data for events having a same base name but different instance names.

7. The method of claim 1, further comprising:
   merging at least a subset of the first set of test patterns with at least a subset of the second set of test patterns to form a combined set of test patterns, wherein each test pattern in the at least a subset of the second set of test patterns triggers an event not triggered by any test pattern in the at least a subset of the first set of test patterns.

8. A computer program product in a non-transitory computer-readable storage medium comprising functional descriptive material that, when executed by a computer, directs the computer to perform actions of:
   obtaining a first test result vector corresponding to a first set of test patterns applied to a first design under test, wherein the first test result vector indicates coverage of one or more events triggered by the first set of test patterns;
   obtaining a second test result vector corresponding to a second set of test patterns applied to a second design under test, wherein the second test result vector indicates coverage of one or more events triggered by the second set of test patterns and wherein the one or more events triggered by the second set of test patterns includes one or more of the one or more events triggered by the first set of test patterns; and
   merging coverage data from at least the first test result vector and the second test result vector to obtain a merged event coverage vector, wherein the merged event coverage vector has a length that is less than a sum of lengths of the first test result vector and the second test result vector and wherein the merged event coverage vector indicates coverage of events triggered by at least the first set of test patterns and the second set of test patterns, and wherein the merged event coverage vector contains a plurality of entries and each of the plurality of entries is a value representing whether a corresponding event was covered.

9. The computer program product of claim 1, wherein the first test result vector is obtained from a first computer system and the second test result vector is obtained from a second computer system.

10. The computer program product of claim 9, wherein the merging comprises performing a logical-or of corresponding entries from the first test result vector and the second test result vector to obtain the plurality of entries in the merged event coverage vector.

11. The computer program product of claim 9, wherein the merged event coverage vector contains a plurality of entries and each of the plurality of entries is a numerical value representing a number of times a corresponding event was covered.

12. The computer program product of claim 11, wherein the merging comprises summing corresponding entries from the first test result vector and the second test result vector to obtain the plurality of entries in the merged event coverage vector.

13. The computer program product of claim 9, comprising functional descriptive material that, when executed by the computer, causes the computer to perform an additional action of:
  obtaining an event dictionary wherein events represented in the first test result vector and the second test result vector are correlated to the event dictionary.

14. The computer program product of claim 9, comprising functional descriptive material that, when executed by the computer, causes the computer to perform an additional action of:
  combining, into a single value, test coverage data for events having a same base name but different instance names.

15. The computer program product of claim 9, The computer program product of claim 9, comprising functional descriptive material that, when executed by the computer, causes the computer to perform an additional action of:
  merging at least a subset of the first set of test patterns with at least a subset of the second set of test patterns to form a combined set of test patterns, wherein each test pattern in the at least a subset of the second set of test patterns triggers an event not triggered by any test pattern in the at least a subset of the first set of test patterns.

16. A data processing system comprising:
  one or more processors;
  at least one data store associated with the one or more processors; and
  a set of instructions contained in the at least one data store, wherein the one or more processors executes the set of instructions to perform actions of:
    obtaining a first test result vector corresponding to a first set of test patterns applied to a first design under test, wherein the first test result vector indicates coverage of one or more events triggered by the first set of test patterns;
    obtaining a second test result vector corresponding to a second set of test patterns applied to a second design under test, wherein the second test result vector indicates coverage of one or more events triggered by the second set of test patterns and wherein the one or more events triggered by the second set of test patterns includes one or more of the one or more events triggered by the first set of test patterns; and
    merging coverage data from at least the first test result vector and the second test result vector to obtain a merged event coverage vector, wherein the merged event coverage vector has a length that is less than a sum of lengths of the first test result vector and the second test result vector and wherein the merged event coverage vector indicates coverage of events triggered by at least the first set of test patterns and the second set of test patterns, and wherein the merged event coverage vector contains a plurality of entries and each of the plurality of entries is a value representing whether a corresponding event was covered.

17. The data processing system of claim 16, wherein the merging comprises performing a logical-or of corresponding entries from the first test result vector and the second test result vector to obtain the plurality of entries in the merged event coverage vector.

18. The data processing system of claim 16, wherein the merged event coverage vector contains a plurality of entries and each of the plurality of entries is a numerical value representing a number of times a corresponding event was covered.

19. The data processing system of claim 18, wherein the merging comprises summing corresponding entries from the first test result vector and the second test result vector to obtain the plurality of entries in the merged event coverage vector.

20. The data processing system of claim 16, wherein the one or more processors executes the set of instructions to perform an additional action of:
  obtaining an event dictionary wherein events represented in the first test result vector and the second test result vector are correlated to the event dictionary.

* * * * *